(12) United States Patent
Chang et al.

(10) Patent No.: US 9,786,710 B2
(45) Date of Patent: Oct. 10, 2017

(54) IMAGE SENSOR DEVICE WITH SUB-ISOLATION IN PIXELS

(71) Applicant: TAIWAN SEMICONDUCTOR MANUFACTURING CO., LTD., Hsinchu (TW)

(72) Inventors: Su-Hua Chang, Chiayi County (TW); Volume Chien, Tainan (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/871,409

(22) Filed: Sep. 30, 2015

(65) Prior Publication Data

US 2017/0092684 A1    Mar. 30, 2017

(51) Int. Cl.
*H01L 27/146* (2006.01)

(52) U.S. Cl.
CPC .... *H01L 27/14645* (2013.01); *H01L 27/1463* (2013.01); *H01L 27/1464* (2013.01); *H01L 27/14612* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| 2010/0253819 | A1* | 10/2010 | Yokozawa | H01L 27/1463 348/273 |
| 2011/0032376 | A1* | 2/2011 | Takizawa | H01L 27/14627 348/222.1 |
| 2011/0291162 | A1* | 12/2011 | Mori | H01L 21/266 257/231 |
| 2012/0009720 | A1* | 1/2012 | Shim | H01L 27/14625 438/70 |
| 2014/0264685 | A1* | 9/2014 | Cheng | H01L 31/02327 257/432 |
| 2014/0340541 | A1* | 11/2014 | Shimotsusa | H01L 27/14627 348/222.1 |
| 2014/0374867 | A1* | 12/2014 | De Munck | H01L 31/03529 257/443 |
| 2015/0270298 | A1* | 9/2015 | Lin | H01L 27/14627 257/432 |

* cited by examiner

*Primary Examiner* — Johannes P Mondt
(74) *Attorney, Agent, or Firm* — Maschoff Brennan

(57) ABSTRACT

An image sensor device includes a substrate, a color filter layer, at least a pixel, a main isolation structure and a sub-isolation structure. The color filter layer is disposed over the substrate. The color filter layer includes a first color filter having a single one of primary colors. The pixel is disposed in the substrate and aligned with the first color filter. The main isolation structure surrounds the pixel in the substrate. The sub-isolation structure is disposed to divide the pixel into a plurality of sub-first pixels. The sub-pixels correspond to the first color filter having the single one of primary colors, and each of the sub-first pixels includes a radiation sensor.

18 Claims, 7 Drawing Sheets

IMAGE SENSOR DEVICE WITH SUB-ISOLATION IN PIXELS

BACKGROUND

Semiconductor image sensors are used in various imaging devices, such as video cameras. An image sensor device includes an array of picture elements (pixels) for detecting incident light and recording an intensity of the incident light. Typically, an image sensor device includes charge-coupled device (CCD) image sensors or complimentary metal-oxide-semiconductor (CMOS) image sensor devices. The CMOS image sensor generally utilizes light-sensitive CMOS circuitry to convert photons into electrons. The light-sensitive CMOS circuitry typically includes a photo-diode formed in a substrate. As the photo-diode is exposed to light, an electrical charge is induced in the photo-diode. Each pixel may generate electrons in response to incident light. The electrons are converted into a voltage signal in the pixel and further transformed into a digital signal. In image sensor industrial, increasing the resolution of the image sensor is continuously an aim.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
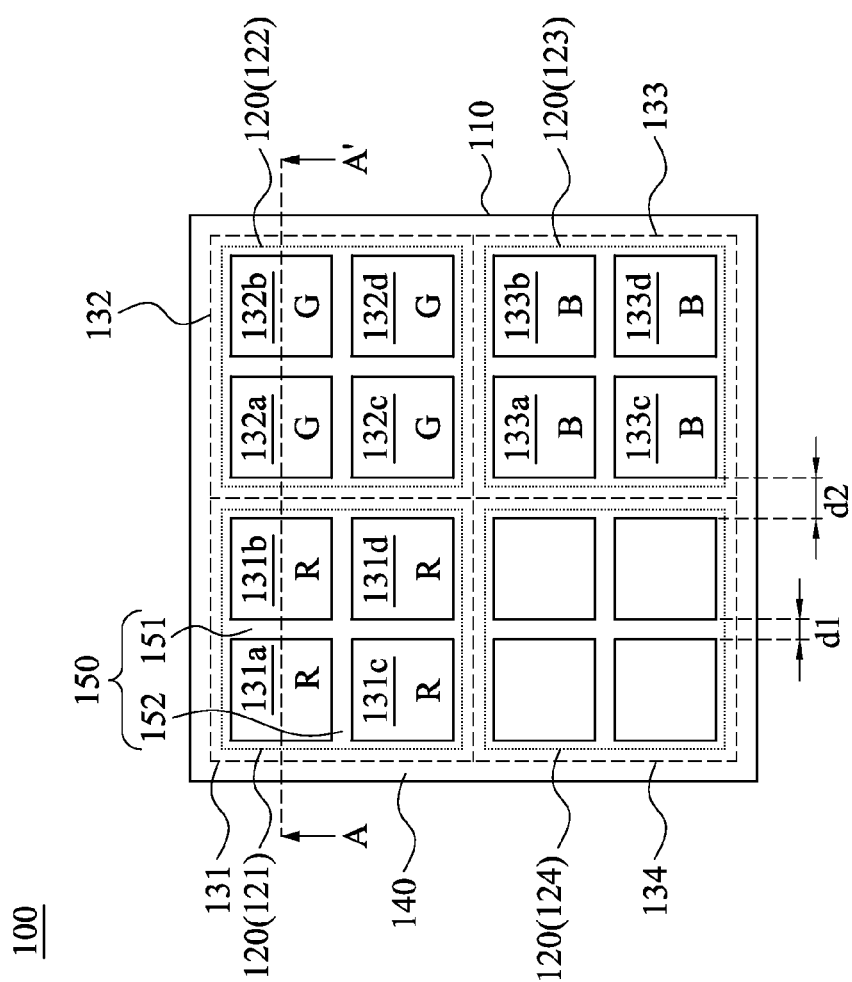
FIG. 1 is a plan view schematically illustrating an image sensor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to an image sensor device. Image sensors can be classified as front-side illuminated (FSI) image sensors and back-side illuminated (BSI) image sensors, depending on the light path difference. In an FSI image sensor, light from the subject scene is incident on the front side of the image sensor, passing through dielectric layers and interconnect layers thereon. On the other hand, in a BSI image sensor, light is incident on the backside of the image sensor, in which the substrate of BSI image sensor is thinned for improving the quantum efficiency. According to various embodiments of the present disclosure, the image sensor device disclosed herein provides an increased resolution while the signal-noise ratio (SNR) and the quantum efficiency (QE) of the image sensor device are not unfavorably degraded. The embodiments of present disclosure may be implemented in any of BSI image sensors and FSI image sensors.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
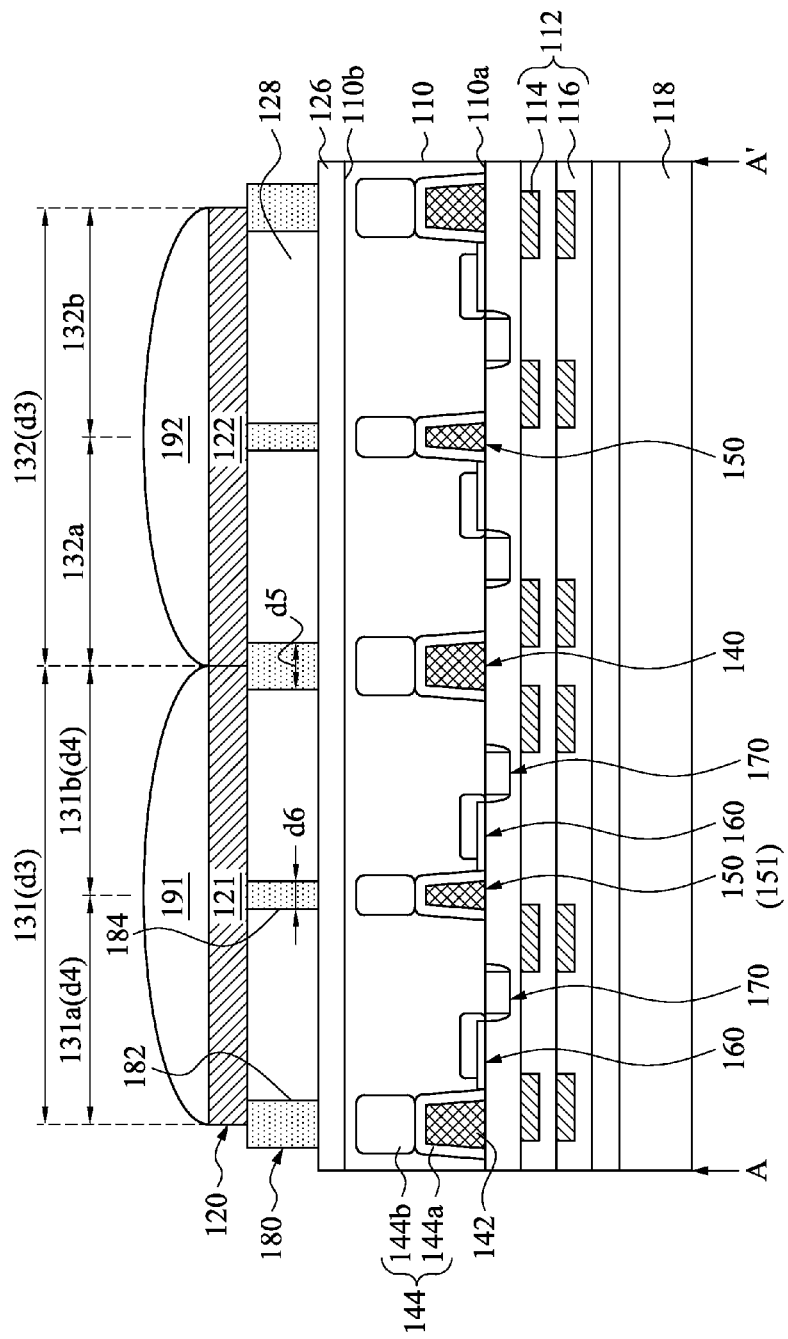
FIG. 2 is a cross-sectional view taken along line AA' in FIG. 1.

FIG. 1 is a plan view schematically illustrating an image sensor device 100 according to various embodiments of the present disclosure. FIG. 2 is a cross-sectional view taken along line AA' in FIG. 1. The image sensor device 100 is a back-side illuminated (BSI) image sensor, and includes a substrate 110 and a plurality of pixels such as for example a first pixel 131, a second pixel 132, a third pixel 133 and a forth pixel 134. Referring to FIG. 1 and FIG. 2, the image sensor device 100 further includes a color filter layer 120, a main isolation structure 140 and a sub-isolation structure 150.

As illustrated in FIG. 1 and FIG. 2, the substrate 110 includes a front side 110a and a backside 110b, and a pixel array including pixels 131, 132, 133 and 134 are fabricated on the front side 110a of the substrate 110. In various embodiments, the first pixel 131 is adjacent to the second pixel 132, which is adjacent to the third pixel 133. Further, the forth pixel 134 is adjacent to the third pixel 133 and the first pixel 131. In various embodiments, the substrate may include a semiconductor substrate. The semiconductor substrate, for example, may include silicon. In some embodiments, the semiconductor substrate may include other elementary semiconductor such as for example germanium. In yet some embodiments, the semiconductor substrate 101 may include an alloy semiconductor such as for example silicon germanium, silicon germanium carbide, gallium indium phosphide and the like. In yet some embodiments, the semiconductor substrate 101 may include compound semiconductor such as for example gallium arsenic, silicon carbide, indium phosphide, indium arsenide and the like. In yet some embodiments, the semiconductor substrate 101 may include a semiconductor-on-insulator (SOI) structure.

The color filter layer 120 is disposed over the substrate 110, as shown in FIG. 2. The color filter layer 120 includes a plurality of color filters, and each of the color filters corresponds to one of the pixels. In specifics, the color filter layer 120 may include a first color filter 121 a second color filter 122, and third color filter 123. Each of the first, second and third color filters 121, 122, 123 has a single one of primary colors, i.e. red (R), green (G), and blue (B), but each of the first, second and third color filters 121, 122, 123 has a primary color different from another one. In some embodiments, the first color filters 121 may transmit a light in red wavelength band, and the second color filter 122 may transmit a light in green wavelength band. Further, the third color filter 123 transmits light in blue wavelength band. In yet some embodiments, the color filter layer 120 may further include a fourth color filter 124 that transmits light in any of red, green, blue and yellow wavelength bands.

Each of the pixels corresponds to one of the color filters having the single one of the primary colors. For example, the first color filter 121, the second color filter 122 and the third color filter 123 respectively correspond to the first pixel 131, the second pixel 132 and the third pixel 133, and therefore the first, second and third pixels 131, 132, 133 respectively receive and detect red, green and blue lights. In various embodiments, the first pixel 131, the second pixel 132 and the third pixel 133 are respectively aligned with the first color filter 121, the second color filter 122 and the third color filter 123. In some examples, the forth pixels 134 is aligned with the fourth color filter 124. In yet some examples, the area of each pixel is substantially equal to the area of the corresponding color filter.

The main isolation structure 140 separates each of the pixels from one another. In some embodiments, the main isolation structure 140 may surround each of the first pixel 131, the second pixel 132, the third pixel 133 and the fourth pixel 134 in a plan view, as shown in FIG. 1. Illustrative examples of the main isolation structure 140 include a shallow trench isolation (STI), a deep trench isolation (DTI), an implant region, and the like, and a combination thereof. In some embodiments, as illustrated in FIG. 2, the main isolation structure 140 includes a shallow trench isolation 142. In yet some embodiments, the main isolation structure 140 may include a shallow trench isolation 142 and an implant region 144. The implant region 144 may include a cell P-well 144a and a deep P-well 144b, in which the shallow trench isolation 142 is formed in the cell P-well 144a. Other insulation structures or features known in the art may also be employed to form the main isolation structure 140.

The sub-isolation structure 150 is disposed to divide each pixel into a plurality of sub-pixels. In some embodiments, the sub-isolation structure 150 divides the first pixel 131 into a plurality of sub-first pixels such as for example sub-first pixels 131a, 131b, 131c and 131d, as depicted in FIG. 1. The sub-first pixels 131a, 131b, 131c and 131d correspond to the first color filter 121 which has the single one of the primary colors, and therefore each of the sub-first pixels 31a, 131b, 131c and 131d receives and detects the light in certain color, for example in red color. Similarly, the sub-isolation structure 150 divides the second pixel 132 and the third pixel 133 respectively into sub-second pixels 132a, 132b, 132c and 132d as well as sub-third pixels 133a, 133b, 133c and 133d. The sub-second pixels 132a, 132b, 132c and 132d correspond to the second color filter 122, and therefore each of the sub-second pixels 132a, 132b, 132c and 132d receives and detects the light in certain color, for example in green color. Further, the sub-third pixels 133a, 133b, 133c and 133d correspond to the third color filter 123, and therefore each of the sub-third pixels 133a, 133b, 133c and 133d receives and detects the light in certain color, for example in blue. It is noted that the sub-pixels of each pixel is configured to sense or detect light in a substantially the same color.

In various embodiments, the sub-isolation structure 150 has a width d1 that is less than or equal to a width d2 of the main isolation structure 140. In some embodiments, the width d1 of the sub-isolation structure 150 is approximately 20%-90% of the width d2 of the main isolation structure 140, for example about 25%, 30%, 35%, 40%, 50%, 60%, 70%, or 80% of the width d2.

In some embodiments, the sub-isolation structure 150 includes a first portion 151 and a second portion 152, as depicted in FIG. 1. The first portion 151 and the second portion 152 extend in different directions, and intersect with each other so to divide the first pixel 131 into four sub-first pixels 131a, 131b, 131c and 131d. In some examples, the first portion 151 is perpendicular to the second portion 152. In yet some examples, the sub-first pixels 131a, 131b, 131c and 131d are of substantially equal area. It is noted that the sub-isolation structure 150 may be designed in a variety of configurations, sizes and shapes, and each pixel may be divided into several sub-pixels rather than four although FIG. 1 depicts each pixel being divided into four sub-pixels. Further, one of the sub-pixels may have an area different from that of another one of the sub-pixels in the same pixel.

Illustrative examples of the sub-isolation structure 150 include a shallow trench isolation (STI), a deep trench isolation (DTI), an implant region, and the like, and a combination thereof. In some embodiments, the sub-isolation structure 150 has a structure similar to the structure of the main isolation structure. For example, the sub-isolation structure 150 may include a shallow trench isolation and an implant region including a cell P-well and a deep P-well, in which the shallow trench isolation is formed in the cell P-well. Other insulation structures or features known in the art may also be employed to form the sub-isolation structure 150.

It is noted that each of the main isolation structure 140 and the sub-isolation structure 150 may further includes other isolation structures such as for example metal grid and/or dielectric grid according to some embodiments of the present disclosure, which is described in detail hereinafter.

In some embodiments, each of the first pixel 131, the second first pixel 132 and the third pixel 133 has a width d3 ranged from about 0.8 µm to about 3.0 µm, for example 1.0 µm, 1.5 µm, 2.0 µm and 2.5 µm. In yet some embodiments, each sub-pixel has a width d4 ranged from about 0.4 µm to about 1.0 µm, for example 0.5 µm, 0.6 µm, 0.7 µm and 0.9 µm.

Each of the sub-pixels includes a sensing circuit. For example, each of the sub-pixels 131a-131d, 132a-132d and 133a-133d may include a radiation sensor 160. In some embodiments, the radiation sensor 160 may include a photodiode. In examples, the radiation sensor 160 includes a pinned layer photodiode, which includes an n-type doped region formed in a p-type substrate, and a heavily doped p-type region formed on the surface of the n-type doped region to form a p-n-p junction. Other examples of the radiation sensor 160 may include photogates, a complimentary metal-oxide-semiconductor (CMOS) image sensor, a charged coupling device (CCD) sensor, an active sensor, a passive sensor, and/or other types of devices formed in the semiconductor substrate 210. One of ordinary skill in the art will appreciate that the above examples are provided for illustrative purposes only to further explain applications of some illustrative embodiments and are not meant to limit the disclosure in any manner.

In some embodiments, each of the sub-pixels 131a-131d, 132a-132d and 133a-133d may further include one or more transistors 170 electrically couple to the radiation sensor 160. Illustrative examples of the transistors 170 include reset transistors, source follower transistors, transfer transistors and the like, and a combination thereof.

Figure 3:
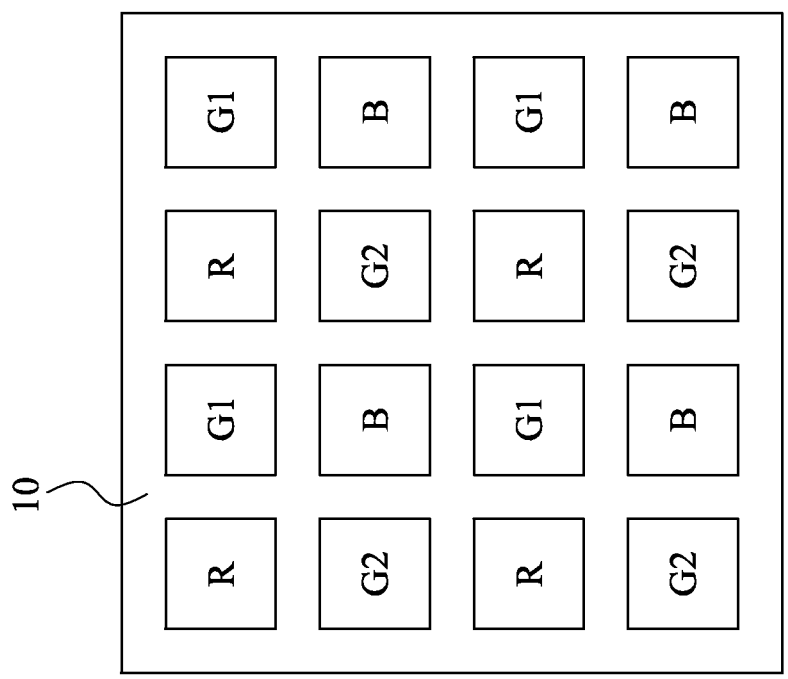
FIG. 3 is a plan view schematically illustrating an image sensor according to a comparative example.

The resolution of the image sensor is increased while the signal-noise ratio (SNR) and the quantum efficiency (QE) are not unfavorably degraded according to various embodiments of the present disclosure. FIG. 3 is a plan view schematically illustrating an image sensor according to a comparative example. In this comparative example, the size of each pixel R, G1, G2 and B of the image sensor is simply reduced to increase the resolution. The isolation structure 10 is configured to separate pixels in different colors. In this comparative example, the width of the isolation structure 10 between two adjacent pixels can not be reduced and is inevitably kept at a minimum value in order to prevent the optical and/or electrical cross-talk phenomenon between two adjacent pixels. Accordingly, when the resolution of the image sensor is increased, the received light and the quantum efficiency are unfavorably decreased because the isolation structure can not be further shrunk. Further, the signal-noise ratio of the image sensor is unfavorably decreased as well in this comparative example. Turning now to FIG. 1, the sub-pixels 131a-131d are configured to receive light in substantially the same color, and thereby the optical crosstalk may be fundamentality eliminated from the sub-pixels 131a-131d. In addition, because the sub-pixels 131a-131d detect light in substantially the same color, the image sensor 100 provides an extensive window for the electrical crosstalk issue. Accordingly, the width of the sub-isolation structure 150 between the sub-pixels 131a-131d may be decreased, and may be narrower than the main isolation structure 140 which separates pixels in different colors. Therefore, according to various embodiments of the present disclosure, the signal-noise ratio and the quantum efficiency of the image sensor are improved as compared to the comparative example shown in FIG. 3.

In some embodiments, referring back to FIG. 2, the image sensor device 100 may further include an interconnection structure 112 on the front side 110a of the substrate 110. The interconnection structure 112 may include one or more conductive structures 114 and one or more interlayer dielectric layers 116. The conductive structures 114 may include metal lines in metal-one layer, metal-two layer, metal-three layer and so on to the top-most layer. The conductive structures 114 may further include contacts for coupling the doped regions to the metal lines in metal-one layer. The conductive structures 114 may include vias to couple adjacent metal layers. The material of the interlayer dielectric layers 116 may include silicon oxide, silicon nitride, silicon oxynitride, low dielectric constant (low k) materials, or the like, or any combination thereof. Illustrated low k materials include fluorinated silica glass (FSG), bis-benzocyclobuteues (BCB), carbon doped silicon oxide, amorphous fluorinated carbon, and/or other materials, for example.

In some embodiments, the image sensor device 100 may further include a carrier substrate 118. The carrier substrate 118 may be bonded with the substrate 110 from the front side 110a, so that processing the backside 110b of the substrate 110 can be performed. For example, the carrier substrate 118 may be bonded on the side of the interconnection structure 112. Additional layers such as passivation layer and adhesive layer (not shown in FIG. 2) may be formed between the carrier substrate 118 and the interconnection structure 112. In some embodiments, the carrier substrate 118 is similar to the substrate 110 and includes silicon material. Alternatively, the carrier substrate 118 may include a glass substrate or another suitable material. The carrier substrate 118 may be bonded to the substrate 110 by molecular forces, i.e., a technique known as direct bonding or optical fusion bonding, or by other bonding techniques known in the art, such as eutectic bonding, metal diffusion or anodic bonding, for example.

In some embodiments, as depicted in FIG. 2, the color filter layer 120 is disposed adjacent to the backside 110b of the substrate 110, and the light form the subject scene is incident on the backside 110b. The radiation sensor 160 in each sub-pixel generates charged carriers in response to the incident light on the backside 110b.

In yet some embodiments, the image sensor device 100 may further include a metal grid 180 disposed between the color filer layer 120 and the backside 110b of the substrate 110. The metal grid 180 includes a major border 182 and at least a minor portion 184 respectively aligned with the main isolation structure 140 and the sub-isolation structure 150. In some examples, the pattern of the major border 182 is substantially identical to the main isolation structure 140 depicted in FIG. 1, and further the pattern of the minor portion 184 is substantially identical to the sub-isolation structure 150. In yet some examples, the width d5 of the major border 182 is greater than the width d6 of the minor portion 184. In examples, the width d6 of the minor portion 184 is approximately 20%-90% of the width d5 of the major border 182, for example about 25%, 30%, 35%, 40%, 50%, 60%, 70%, or 80% of the width d5. In some examples, the metal grid may include metallic material such as copper, tungsten, aluminum, silver, or the like, or a combination thereof. The metal grid 180 functions as optical isolation between adjacent pixels and sub-pixels. In particular, the major border 182 of the metal grid 180 may function as the optical isolation between pixels 131, 132, 133 and 134, and the minor portion 184 may function as the optical isolation between sub-pixels such as sub-pixels 131a-131d, sub-pixels 132a-132d or sub-pixels 133a-133d. Accordingly, the main isolation structure 140 and/or the sub-isolation structure 150 may include an optical isolation structure (e.g., a grid structure) formed over the substrate 110 and an electrical isolation structure (e.g., STI, DTI and implant region) formed in the substrate 110 according to some embodiments of the present disclosure.

In yet some embodiments, the image sensor device 100 may further include a dielectric layer 128 filled in the openings of the metal grid 180. The dielectric layer 128 may be made of transparent materials such as for example silicon oxide, silicon nitride, silicon carbide, titanium nitride, silicon oxynitride, and the like.

In yet some embodiments, the image sensor device 100 may further include an anti-reflective layer 126 disposed on the backside 110b of the substrate 110. In some embodiments, the anti-reflective layer 126 is formed on the backside 110b of the semiconductor substrate 110 for reducing reflection of light incident to the substrate 110. In some embodiments, the semiconductor sensor device 100 further includes a buffer layer (not shown in FIG. 2) interposed between metal grid 180 and the anti-reflective layer 126 for improving manufacturability.

In yet some embodiments, the image sensor device 100 may further include a plurality of micro lenses, such as micro lenses 191 and 192. The micro lenses 191, 192 are disposed over the color filter layer 120 and each of the micro lenses 191, 192 is positioned on a corresponding one of the color filters such as color filters 121, 122. Further, the micro lenses 191, 192 respectively align the sub-pixels 131a-131d of the pixel 131 and the sub-pixels 132a-132d of the pixel 132. Illustrative examples of the material of the micro lenses include silicon oxide with a refractive index of approximately between 1.4 and 1.7, silicon nitride with a refractive index of approximately between 1.9 and 2.5, silicon carbide with a refractive index of approximately between 2.4 and 2.7, titanium nitride with a refractive index of approximately between 0.7 and 2.5, silicon oxynitride with a refractive index of approximately between 1.4 and 1.6, and transparent polymer materials, and the like.

FIGS. 4-7 are cross-sectional views schematically illustrating image sensor devices 100a, 100b, 100c and 100d according to various embodiments of the present disclosure. In FIGS. 4-7, the same or similar features are identified by the same reference numerals. These features are the same as or similar to like-numbered features described with respect to FIGS. 1 and 2. Therefore, the description of these features will be omitted to avoid repetition.

Figure 4:
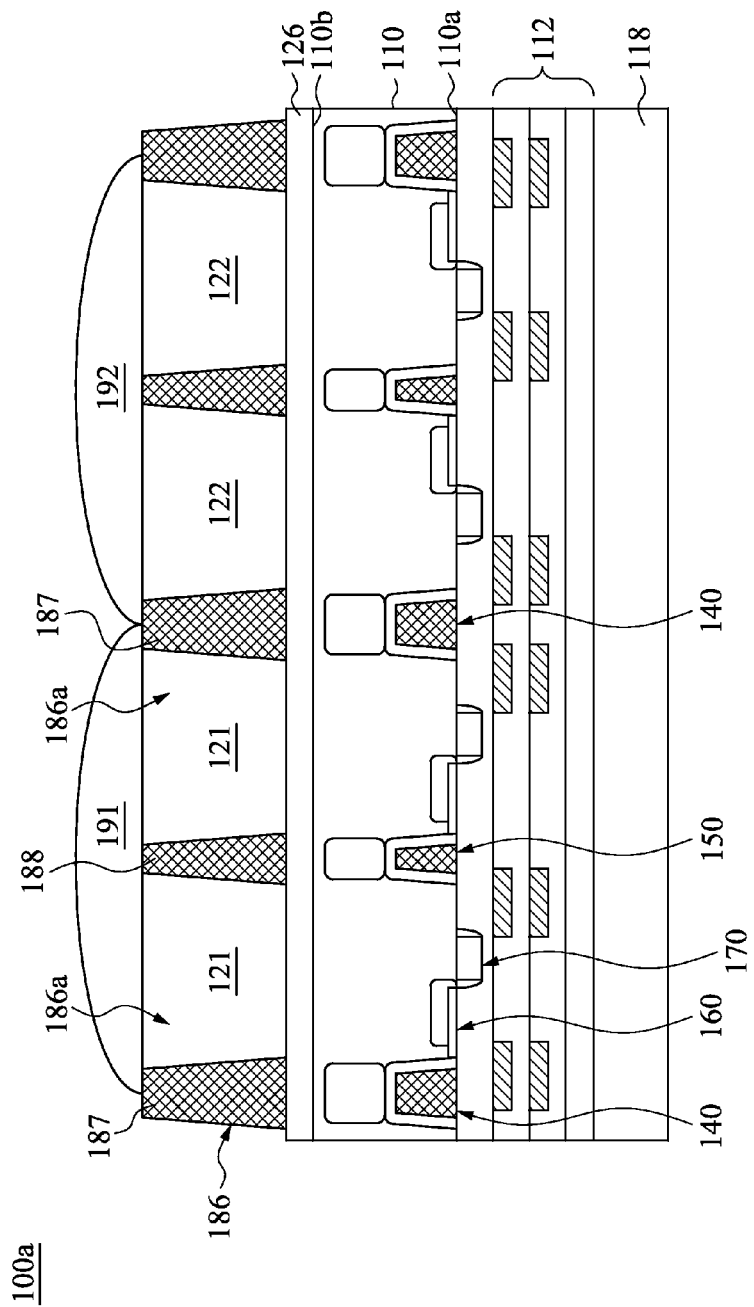
FIGS. 4-7 are cross-sectional views schematically illustrating image sensor devices according to various embodiments of the present disclosure.

With reference to FIG. 4, the image sensor device 100a is characterized in that a dielectric grid 186 having a plurality of openings 186a is disposed over the backside 110b of the substrate 110. The first color filters 121, 122 are filled in the openings 186a. The dielectric grid 186 includes a major border 187 and at least a minor portion 188 respectively aligned with the main isolation structure 140 and the sub-isolation structure 150. Therefore, the pattern of the major border 187 is similar to the main isolation structure 140 depicted in FIG. 1, and further the pattern of the minor portion 188 is substantially identical to the sub-isolation structure 150. In yet some examples, the width of the major border 187 is greater than the width of the minor portion 188. In examples, the width of the minor portion 188 is approximately 20%-90% of the width of the major border 187, for example about 25%, 30%, 35%, 40%, 50%, 60%, 70%, or 80% of the width of the major border 187. The dielectric grid 186, for example, may made of a material such as silicon oxide with a refractive index of approximately between 1.4 and 1.7, silicon nitride with a refractive index of approximately between 1.9 and 2.5, silicon carbide with a refractive index of approximately between 2.4 and 2.7, silicon oxynitride with a refractive index of approximately between 1.4 and 1.6, and the like.

Figure 5:
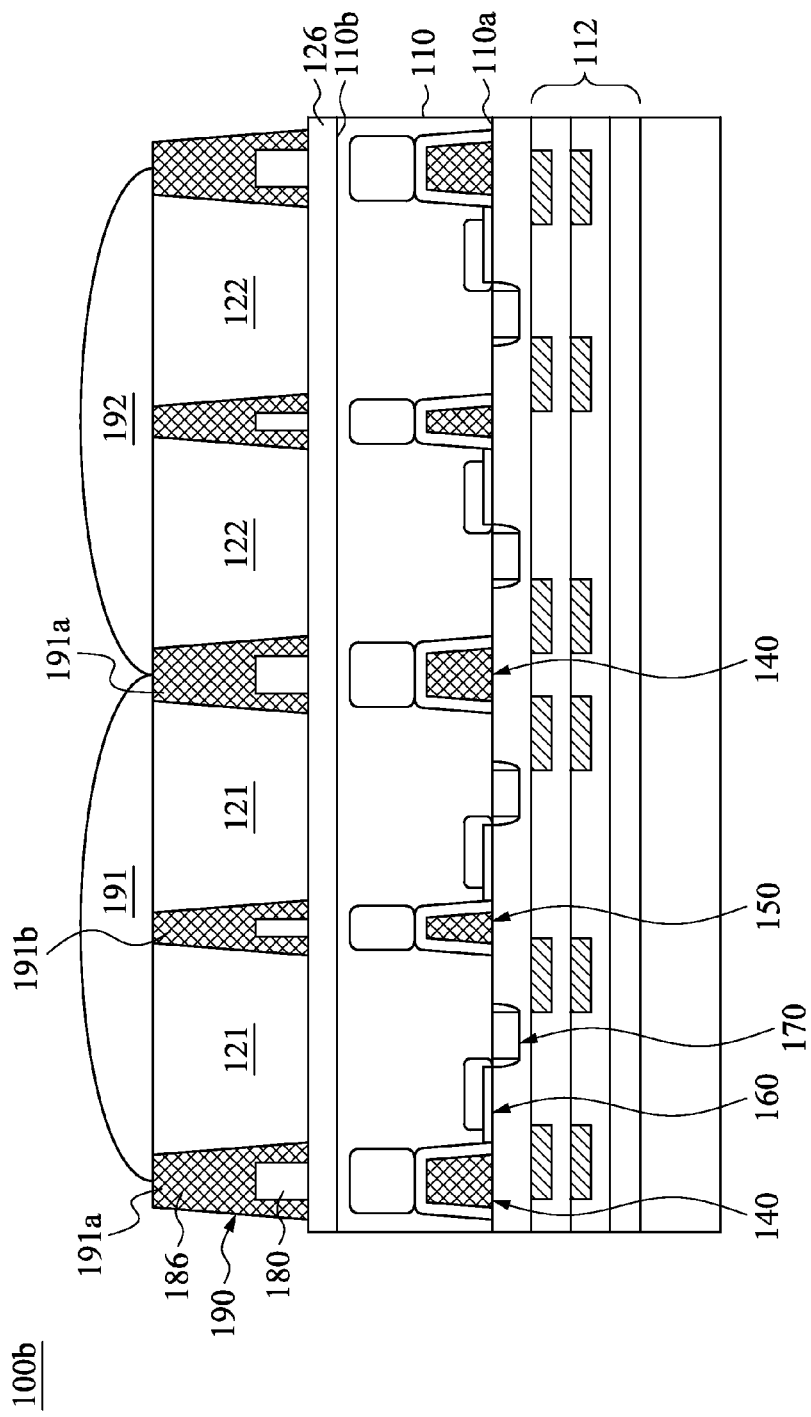

Referring to FIG. 5, the image sensor device 100a is characterized in that a composite grid 190 is disposed over the backside 110b of the substrate 110. The composite grid includes a metal grid 180 and a dielectric grid 186 formed over the metal grid 180. The pattern of the metal grid 180 is aligned with the pattern of dielectric grid 186 so as to constitute the composite grid 190. Further, the pattern of composite grid 190 aligns the patterns of the main isolation structure 140 and the sub-isolation structure 150. In some examples, the composite grid 190 includes a major border 191a and at least a minor portion 191b respectively aligned with the main isolation structure 140 and the sub-isolation structure 150. Therefore, the pattern of the major border 191a is similar to the main isolation structure 140 depicted in FIG. 1, and further the pattern of the minor portion 191b is similar to the sub-isolation structure 150. In yet some examples, the width of the major border 191a is greater than the width of the minor portion 191b. In some examples, the width of the minor portion 191b is approximately 20%-90% of the width of the major border 191a, for example about 25%, 30%, 35%, 40%, 50%, 60%, 70%, or 80% of the width of the major border 182.

Figure 6:
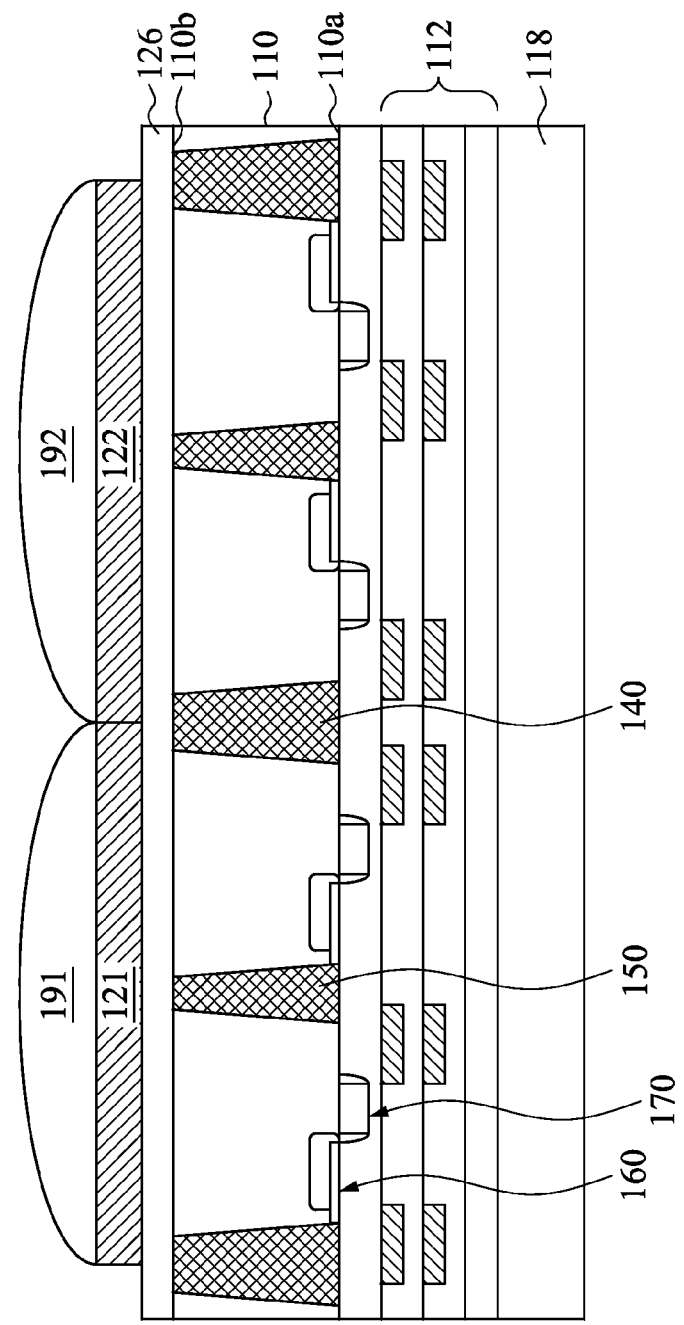

With reference to FIG. 6, the image sensor device 100a features in that the main isolation structure 140 and/or the sub-isolation structure 150 include deep trench isolation (DTI) structures. In some embodiments, the deep trench isolation structures may pass through the substrate 110. For example, the deep trench isolation structures may be formed in the front side 110a of the substrate 110, and then the obtained substrate 110 is bonded with the carrier substrate 118. Additional layers such as passivation layer and adhesive layer may be formed between the carrier substrate 118 and the interconnection structure 112. A thinning process, e.g. grinding and/or etching, may be performed on the backside 110b of the substrate 110 to remove the remaining portion of the substrate so that the deep trench isolation structures is exposed out. In yet some embodiments, the deep trench isolation structures do not pass through the substrate 110, and other insulation features such as for example implant region may be used together to constitute the main isolation structure 140 and/or the sub-isolation structure 150. The width of the DTI structure of the sub-isolation structure 150 is less than that of the main isolation structure 140. In some embodiments, the width of the DTI structure of the sub-isolation structure 150 is approximately 20%-90% of the width of the main isolation structure 140.

Figure 7:
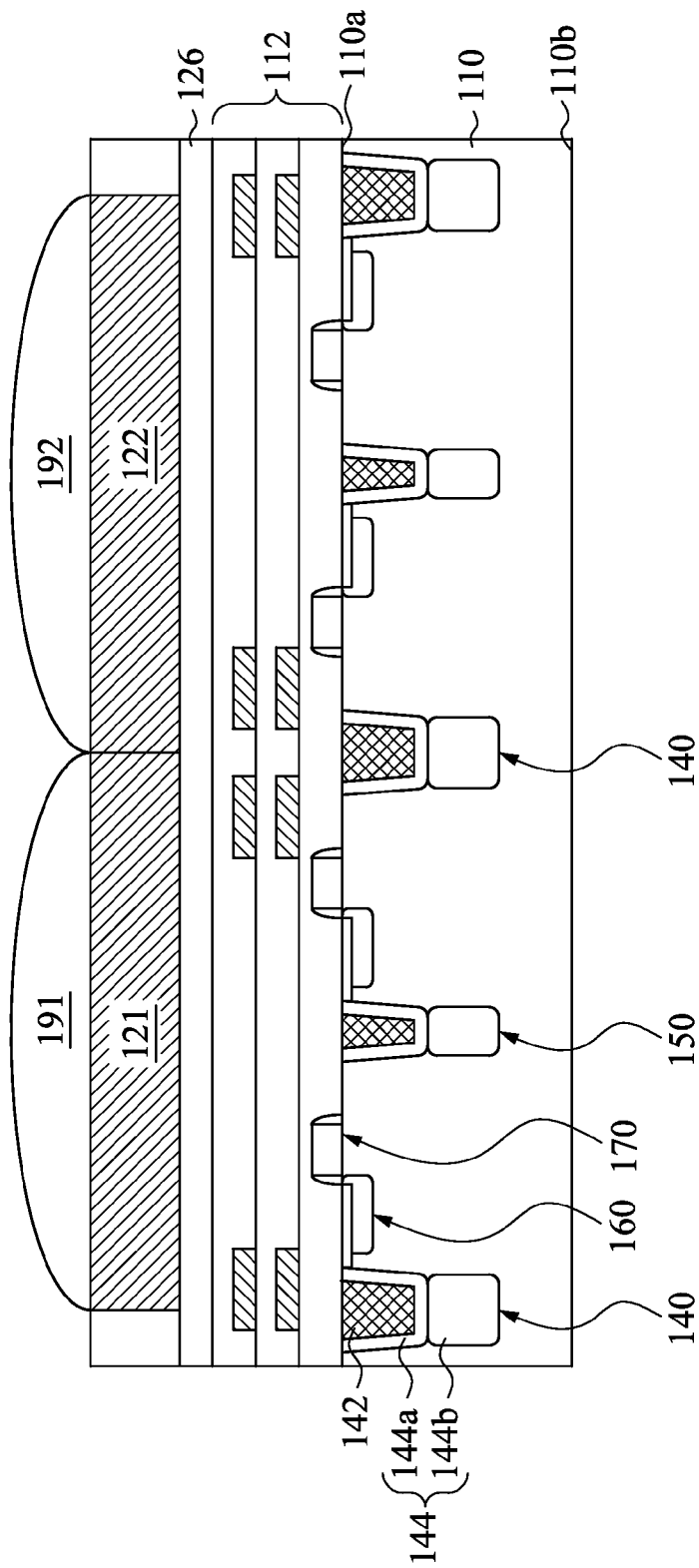

With reference to FIG. 7, the image sensor device 100d is a front-side illuminated (FSI) image sensor. Light from the subject scene is incident on the front side 110a of the substrate 110, passing through the micro lenses 191, 192, the color filter 121, 122 and the dielectric layers of the interconnection structure 112. The radiation sensor 160 generates charged carriers in response to the incident light from the front side 110a. In some embodiments, as illustrated in FIG. 7, the main isolation structure 140 includes a shallow trench isolation 142. In yet some embodiments, the main isolation structure 140 may include a shallow trench isolation 142 and an implant region 144. The implant region 144 may include a cell P-well 144a and a deep P-well 144b, in which the shallow trench isolation 142 is formed in the cell P-well 144a. The sub-isolation structure 150 is disposed to divide each pixel into a plurality of sub-pixels. The sub-isolation structure 150 may include a shallow trench isolation, a deep trench isolation, an implant region, or the like, or a combination thereof. In some embodiments, the sub-isolation structure 150 has a structure similar to the structure of the main isolation structure 140. Specifically, the sub-isolation structure 150 may include a shallow trench isolation and an implant region including a cell P-well and a deep P-well, in which the shallow trench isolation is formed in the cell P-well.

Advantages of various embodiments of the present disclosure include providing a novel image sensor device. The image sensor device disclosed herein provides an increased resolution while the signal-noise ratio (SNR) and the quantum efficiency (QE) of the image sensor device are not unfavorably degraded.

In accordance with one aspect of some embodiments, an image sensor device includes a substrate, a color filter layer, a first pixel, a main isolation structure and a sub-isolation structure. The color filter layer is disposed over the substrate. The color filter layer includes a first color filter having a single one of primary colors. The first pixel is disposed in the substrate and aligned with the first color filter. The main isolation structure surrounds the first pixel in the substrate.

The sub-isolation structure is disposed to divide the first pixel into a plurality of sub-first pixels. The sub-first pixels correspond to the first color filter having the single one of primary colors, and each of the sub-first pixels includes a radiation sensor.

In accordance with another aspect of some embodiments, an image sensor device includes a substrate, a color filter, at least a pixel, a main isolation structure and a sub-isolation structure. The color filter is disposed over the substrate, and has a single one of primary colors. The pixel is disposed in the substrate and aligned with the color filter. The main isolation structure surrounds the pixel in the substrate. The sub-isolation structure is disposed to divide the pixel into a plurality of sub-pixels. The sub-pixels of the pixel are configured to generate carriers is response to an incident light passing through the color filter having the single one of the primary colors. The width of the sub-isolation structure is about 30%-80% of the width of the main isolation structure.

In accordance with another aspect of some embodiments, an image sensor device includes a substrate, a color filter layer, a plurality of pixels, a main isolation structure and a sub-isolation structure. The color filter layer is disposed over the substrate. The color filter layer includes a first color filter, a second color filter and a third color filter each having a single one of primary colors. The pixels are disposed in the substrate and each aligned with one of the first, second and third color filters. The main isolation structure separates the pixels from each other in the substrate. The sub-isolation structure is disposed to divide each pixel into a plurality of sub-pixels. Each of the sub pixels includes a radiation sensor, and the sub-pixels of each pixel are configured to receive light passing through an identical one of the first, second and third color filters.

What is claimed is:

1. An image sensor device, comprising:
   a substrate;
   a color filter layer disposed over the substrate, wherein the color filter layer comprises a first color filter having a single one of primary colors;
   a first pixel disposed in the substrate and aligned with the first color filter, wherein the first pixel comprises a plurality of sub-first pixels each having a radiation sensor, and the sub-first pixels correspond to the first color filter having the single one of the primary colors;
   a main isolation structure surrounding the first pixel in the substrate; and
   a sub-isolation structure separating adjacent ones of the sub-first pixels and isolating one of the radiation sensors from another one of the radiation sensors, wherein the sub-isolation structure has a width less than a width of the main isolation structure, and the sub-isolation structure has a height substantially equal to a height of the main isolation structure.

2. The image sensor device according to claim 1, wherein the width of the sub-isolation structure is about 20%-80% of the width of the main isolation structure.

3. The image sensor device according to claim 1, wherein the substrate has a front side and a backside, the color filter layer is disposed adjacent to the backside, and the radiation sensor generates charged carriers in response to an incident light from the backside.

4. The image sensor device according to claim 3, further comprising a metal grid disposed between the color filter layer and the backside of the substrate, wherein the metal grid comprises a major border and at least a minor portion respectively aligned with the main isolation structure and the sub-isolation structure.

5. The image sensor device according to claim 3, further comprising a dielectric grid having a plurality of openings and disposed over the backside of the substrate, wherein the dielectric grid comprises a major border and at least a minor portion respectively aligned with the main isolation structure and the sub-isolation structure, and the first color filter is filled in the openings.

6. The image sensor device according to claim 3, further comprising a composite grid disposed over the backside of the substrate, wherein the composite grid comprises a metal grid and a dielectric grid over the metal grid, and the composite grid aligns the main isolation structure and the sub-isolation structure.

7. The image sensor device according to claim 1, wherein the main isolation structure includes at least one of a shallow trench isolation, a deep trench isolation, and an implant region.

8. The image sensor device according to claim 1, wherein the sub-isolation structure includes at least one of a shallow trench isolation, a deep trench isolation, and an implant region.

9. The image sensor device according to claim 1, wherein the sub-isolation structure comprises a first portion and second portion intersecting with the first portion so to divide the first pixel into four sub-first pixels.

10. The image sensor device according to claim 1, wherein the first pixel has a width of about 0.8 µm to about 2.0 µm.

11. The image sensor device according to claim 1, wherein each of the sub-first pixels a width of about 0.4 µm to about 1.0 µm.

12. The image sensor device according to claim 1, further comprising a micro lens disposed over the first color filter, wherein the micro lens aligns with the plurality of the sub-first pixels.

13. The image sensor device according to claim 1, further comprising an interconnection structure on a front side of the substrate such that the interconnection structure is interposed between the color filter layer and the substrate, wherein the radiation sensor generates charged carriers in response to an incident light from the front side.

14. The image sensor device according to claim 1, wherein each of the first sub-first pixels further comprises a transistor electrically couple to the radiation sensor.

15. The image sensor device according to claim 1, wherein the single one of the primary colors is one of red, green, and blue.

16. The image sensor device according to claim 1, further comprising a second pixel adjacent to the first pixel in the substrate, wherein the color filter layer further comprises a second color filter having another one of the primary colors, and the second pixel aligns with the second color filter, wherein the main isolation structure separates the first pixel from the second pixel, and the sub-isolation structure further divide the second pixel into a plurality of sub-second pixels.

17. An image sensor device, comprising:
   a substrate;
   a color filter disposed over the substrate, wherein the color filter has a single one of primary colors;
   a pixel disposed in the substrate and aligned with the color filter, wherein the pixel comprises a plurality of sub-pixels each having a radiation sensor, and the sub-pixels correspond to the color filter having the single one of the primary colors;

a main isolation structure surrounding the pixel in the substrate;

a sub-isolation structure separating adjacent ones of the sub-pixels and isolating one of the radiation sensors from another one of the radiation sensors, wherein the sub-isolation structure has a width that is about 30%-80% of a width of the main isolation structure, and the sub-isolation structure has a height substantially equal to a height of the main isolation structure; and a grid structure over the main isolation structure and the sub-isolation structure, wherein the grid structure comprises a major border and a minor portion having a width less than a width of the major border, and the minor portion has a pattern substantially identical to a pattern of the sub-isolation structure in a plan view.

18. An image sensor device, comprising:

a substrate;

a color filter layer disposed over the substrate, wherein the color filter layer comprises a first color filter, a second color filter, and a third color filter each having a single one of primary colors;

a plurality of pixels disposed in the substrate and each aligned with one of the first, second, and third color filters;

a main isolation structure separating the pixels from each other in the substrate; and a sub-isolation structure disposed to divide each pixel into a plurality of sub-pixels, wherein each of the sub-pixels comprises a radiation sensor, and the sub-pixels of each pixel are configured to receive light passing through an identical one of the first, second, and third color filters, wherein the sub-isolation structure isolates one of the radiation sensors from another one of the radiation sensors in a single one of the pixels, wherein the sub-isolation structure has a width less than a width of the main isolation structure, and the sub-isolation structure has a height substantially equal to a height of the main isolation structure; and a grid structure over the main isolation structure and the sub-isolation structure, wherein the grid structure comprises a major border and a minor portion having a width less than a width of the major border, and the minor portion has a pattern substantially identical to a pattern of the sub-isolation structure in a plan view.

* * * * *